United States Patent [19]

Kawamura et al.

[11] 4,409,311

[45] Oct. 11, 1983

[54] PHOTOSENSITIVE MEMBER

[75] Inventors: Takao Kawamura, Senboku Seiwadai Koporasu 717-Go, 398-1, Tsujino, Sakai-Shi, Osaka-Fu; Yoshida Masazumi, Amagasaki, both of Japan

[73] Assignees: Minolta Camera Kabushiki Kaisha; Takao Kawamura; Kyoto Ceramic Co., Ltd., all of Japan

[21] Appl. No.: 355,377

[22] Filed: Mar. 8, 1982

[30] Foreign Application Priority Data

Mar. 25, 1981 [JP] Japan .................................. 56-44498
Mar. 25, 1981 [JP] Japan .................................. 56-44499

[51] Int. Cl.³ .......................... H01L 45/00; B05P 5/12
[52] U.S. Cl. ...................................... 430/95; 427/74; 357/2; 252/501.1
[58] Field of Search ........................ 430/84, 95; 357/2; 204/192 R, 192 P; 427/39, 74; 252/501.1

[56] References Cited

U.S. PATENT DOCUMENTS

| 4,217,374 | 8/1980 | Ovshinsky et al. | 430/84 X |
| 4,226,898 | 10/1980 | Ovshinsky et al. | 430/84 X |
| 4,265,991 | 5/1981 | Hirai et al. | 430/64 |
| 4,297,392 | 10/1981 | Higashi et al. | 430/84 X |
| 4,356,246 | 10/1982 | Tabei et al. | 430/84 X |

FOREIGN PATENT DOCUMENTS

| 2746967 | 4/1979 | Fed. Rep. of Germany | 430/84 |
| 39223 | 11/1981 | European Pat. Off. | 430/84 |
| 45204 | 2/1982 | European Pat. Off. | 430/84 |
| 54-145539 | 11/1979 | Japan . | |
| 55-91885 | 7/1980 | Japan . | |

OTHER PUBLICATIONS

"Structural Interpretation of the Vibrational Spectra of a-Si: H Alloys", G. Lucovsky et al., Physical Review B, vol. 19, No. 4, Nov. 15, 1979.

Primary Examiner—Edward C. Kimlin
Assistant Examiner—Merrell C. Cashion
Attorney, Agent, or Firm—Watson, Cole, Grindle & Watson

[57] ABSTRACT

A hydrogen containing amorphous silicon photoconductive layer exhibits infrared absorption peaks between wavenumber of 2000 cm$^{-1}$ where Si-H bonds are predominant and wavenumber of 2090 cm$^{-1}$ where Si-H$_2$ bonds are predominant and has an absorption coefficient ratio of the peaks of 2090 cm$^{-1}$ to 2000 cm$^{-1}$ of about 0.2 to 1.7. Preferably, the photoconductive layer is formed by a glow discharge decomposition and may contain small amount of oxygen and 10 to 20,000 ppm of Group IIIA impurity of the Periodic Table.

5 Claims, 9 Drawing Figures

4,409,311

PHOTOSENSITIVE MEMBER

BACKGROUND OF THE INVENTION

1. Field of the Invention

This invention relates to a photosensitive member having an amorphous silicon photoconductive layer, and more particularly to a hydrogen-containing amorphous silicon photoconductive layer which is useful for electrophotographic copying machines, semiconductor laser beam printers and other applications.

2. Description of the Prior Art

Recent years have seen a surge of research regarding the application of amorphous silicon (hereinafter referred to briefly as a-Si), obtainable by glow discharge decomposition or sputtering, to solar cells, and some such products have been available on the market for some time.

In parallel with the above development, the application of a-Si to an electrophotographic sensitive member has been gathering attention. This is because a-Si is by far superior to the conventional selenium and CdS photosensitive members with respect to freedom from environmental pollution, resistance to heat and abrasion, and other properties. However, the manufacturing technology for a-Si solar cells cannot be directly applied to the production of a-Si photoconductive layers for electrophotography. This is because, whereas the solar cell need only have a dark resistance of about $10^3$ to $10^4$ ohms·cm, it is generally necessary that a photoconductive layer for electrophotography have a dark resistance in excess of $10^{13}$ ohms·cm.

Under the circumstances, Published Unexamined Japanese Patent Application Sho No. 54-145539 discloses an electrophotographic photoconductive layer formed with a-Si produced by glow discharge decomposition or sputtering and containing 10 to 40 atomic percent of hydrogen, 0.1 to 30 atomic percent of oxygen and, if necessary, $10^{-6}$ to $10^{-3}$ atomic percent of impurity of Group IIIA (inclusive of boron) of Periodic Table of the Elements or of Group VA (inclusive of phosphorus) of the same Table. However, when the present inventors actually incorporated the above proportions of hydrogen and impurities, and especially 0.1 atomic percent or more of oxygen, in a-Si and examined the overall electrophotographic characteristics of the resulting layer, it was found that, while the dark resistance of the a-Si was increased to a level suitable for electrophotography, its photosensitivity deteriorated significantly as the oxygen content was increased, and even at an oxygen level of 0.1 atomic percent, the photosensitivity was markedly lower than the conventional photosensitive member in the visible region of the spectrum.

As will be described in detail hereinafter, a-Si contains a fair amount of hydrogen because it is produced from $SiH_4$, $Si_2H_6$, $Si_3H_8$ or the like as the starting material, $B_2H_6$ or the like is employed when a Group IIIA impurity is incorporated, and in glow discharge, hydrogen is sometimes used as the carrier gas. Hydrogen from these sources combine with the Si in the a-Si layer in various modes. The infrared absorption spectrum of an a-Si for solar cell use shows absorptions in the wavenumber region of about 1900 to 2100 cm$^{-1}$, but its absorption peak lies at 2000 cm$^{-1}$. This wavenumber of 2000 cm$^{-1}$ corresponds to the absorption peak of Si-H bonds, while the wavenumber corresponding to Si—H$_2$ bonds is about 2090 cm$^{-1}$. As will become apparent from the subsequent explanation, the infrared absorption coefficient ratio, $\alpha(2090\ cm^{-1})$ to $\alpha(2000\ cm^{-1})$, is an important factor in a-Si photoconductive members for electrophotography. Thus, if the ratio of the absorption coefficient at the wavenumber of 2090 cm$^{-1}$ for Si-H$_2$ bonds to the absorption coefficient at the wavenumber of 2000 cm$^{-1}$ for Si-H bonds is outside of a given range, either the dark resistance of a-Si is considerably reduced or its photosensitivity is sacrificed. Referring to the a-Si solar cell mentioned hereinbefore, since its dark resistance may be as low as $10^3$–$10^4$ ohms·cm and its photosensitivity is also not so critical, it does not matter if the absorption at SiH (2000 cm$^{-1}$) is substantially larger than that at SiH$_2$ (2090 cm$^{-1}$).

However, the a-Si for electrophotography must have high dark resistance and photosensitivity, as well as several other important characteristics, all of which cannot be attained by the conventional production methods. Furthermore, the structure of a-Si varies a great deal with different production methods and conditions, and there has been demanded an a-Si photoconductive layer which would also be excellent in production reproducibility and stability.

SUMMARY OF THE INVENTION

It is, therefore, a primary object of this invention to provide a photosensitive member including an amorphous silicon photoconductive layer which is excellent in electrophotographic characteristics in general, inclusive of dark resistance and photosensitivity, and in production reproducibility and stability as well.

It is another object of this invention to provide a photosensitive member including an amorphous silicon photoconductive layer produced by glow discharge decomposition and having excellent electric charge retention and photosensitivity characteristics.

It is still another object of this invention to provide a photosensitive member including an amorphous silicon photoconductive layer having an excellent dark attenuation characteristic and capable of forming a fine quality picture image.

These and other objects of this invention are accomplished by providing a photosensitive member having an amorphous silicon photoconductive layer containing at least 10 to 40 atomic percent of hydrogen, $10^{-5}$ to $4\times10^{-2}$ atomic percent of oxygen, 10 to 20000 ppm of impurity of Group IIIA of the Periodic Table of the Elements, and having an infrared absorption coefficient ratio $\alpha(2090\ cm^{-1})/\alpha(2000\ cm^{-1})$ of about 0.2 to 1.7.

DETAILED DESCRIPTION OF THE INVENTION

Figure 1:
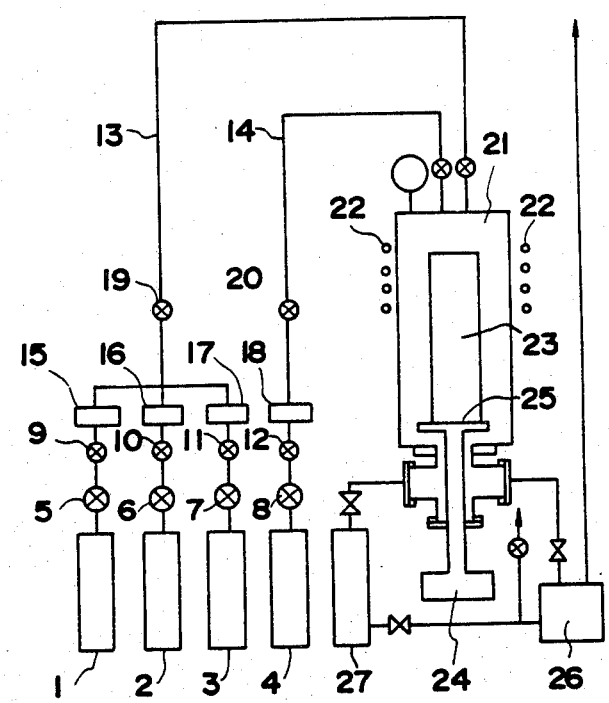
FIGS. 1 and 2 are schematic cross-sectional views depicting respectively a glow discharge decomposition apparatus for producing the amorphous silicon photoconductive layer according to this invention, FIG. 1 being that of induction coupling type and FIG. 2 being of capacitance coupling type.

While a-Si photoconductive layer can be produced by glow discharge decomposition, sputtering and other techniques, it can be made available in a choice of P- and N-semiconductors by selective addition of either an element (preferably boron) of Group IIIA of Periodic Table of the Elements or an element (preferably phosphorus) of Group VA of the same Table. In the production of a-Si, gases such as $SiH_4$, $Si_2H_6$, $Si_3H_8$, etc., are used as starting materials. When boron is incorporated, $B_2H_6$ gas is used and when phosphorus is incorporated, $PH_3$ gas is employed. In both instances, hydrogen, argon, helium or the like is used as the carrier gas. Therefore, in its pure state, an a-Si layer at least contains hydrogen and it is true even when boron or phosphorus is added. However, such a mere inclusion of hydrogen does not increase the dark resistance of a-Si in any appreciable measure and such an a-Si layer is not useful as an electrophotographic photoconductive layer which must have a dark resistance of at least about $10^{13}$ ohm-s·cm.

The reason why the dark resistance of a-Si is inherently inadequate and low is presumably that, because it is amorphous, it contains a large number of dangling bonds. The term dangling bond generally means free electrons not involved in bonds or a cleaved state of covalent bond. In the case of an a-Si film, many superfluous Si atoms appear to be dangling without forming bonds.

The above phenomenon will be further explained. Generally, compared with crystalline Si, a-Si is little influenced by the addition of a impurity from Group IIIA or Group VA of Periodic Table of the Elements, and it is difficult to control electrical conductivity through valency control to P- or N- type. One of the reasons is that because local levels due to the noted numerous dangling bonds exist in band gaps (or mobility gaps), the electrons or positive holes supplied from donors or acceptors are trapped by such local levels so that the Fermi level cannot be shifted a great deal. This is the reason why electroconductivity control by valency control has been considered to be very difficult. In fact, the effect of the addition of an impurity is very small in the case of the a-Si produced by vapor deposition. In contrast, in the case of an a-Si film produced by glow discharge decomposition, where $SiH_4$, $B_2H_6$, etc., are used as gaseous starting materials, hydrogen atoms find their way into the film to link up and destroy dangling bonds so that the local levels decrease. Consequently, electroconductivity control based on valency control by addition of an impurity is rendered somewhat easier.

The present inventors discovered that if about 10 to 40 atomic percent of hydrogen is incorporated in the a-Si layer, the hydrogen atoms combine with a substantially large number of dangling bonds to enable a satisfactory electroconductivity control. However, with this arrangement alone, the dark resistance of a-Si is still too low for use as a photoconductive layer for electrophotography. It appears to be due to the presence of many residual dangling bonds or, as mentioned hereinafter, due to the mode of silicon-hydrogen bonding.

With the above information and assumption, the present inventors sought for a method of achieving an improved dark resistance and discovered that a remarkable improvement in dark resistance can be accomplished by incorporating a suitable quantity of oxygen in the a-Si layer in addition to the above-mentioned incorporation of about 10 to 40 atomic percent of hydrogen. It was found that this incorporation of oxygen eliminates most of the above-mentioned dangling bonds, that is to say, the oxygen atoms are strongly coupled to the Si having the dangling bonds, thus contributing, presumably, to the improved dark resistance. As will be apparent from the working examples given hereinafter, the a-Si photoconductive layer containing both hydrogen and oxygen has a remarkably improved dark resistance, e.g. $10^2$ to $10^7$ times as high as the dark resistance of the H- and O-free photoconductive layer. Thus, there is obtained a a-Si layer having a dark resistance of $10^{-\Omega}$ cm or more. However, conversely the incorporation of oxygen leads to a depression of photosensitivity of the a-Si layer in inverse proportion with the amount of oxygen, and when the amount of oxygen exceeds a certain level, the a-Si layer no longer displays a satisfactory photosensitivity. As will be described in detail hereinafter, it is thus essential that the amount of oxygen to be incorporated in the a-Si photoconductive layer should lie within the range of about $4 \times 10^{-2}$ atomic % at the maximum to about $10^{-5}$ atomic % at the minimum and, preferably, within the range of $10^{-2}$ to $3 \times 10^{-2}$ atomic %. When the a-Si layer is produced by the glow discharge decomposition method, oxygen as such is supplied, either along with $SiH_4$ gas or independently therefrom, into the glow discharge reaction tube. Since the incorporation efficiency of oxygen is very high, it is sufficient to feed only about 1.1 to 2 times the required amount even in the case of maximum incorporation or in the molar $O_2/SiH_4$ ratio of $0.55 \times 10^{-4}$ to $1 \times 10^{-4}$ when it is desired to incorporate $10^{-2}$ atomic % of oxygen, for instance. Of course, as far as the $O_2/SiH_4$ ratio can be maintained within the above range, the oxygen to be fed may be air or a mixture of oxygen with an inert carrier gas such as $H_2$, Ar, He or the like.

The oxygen atoms, due to their high electrical negativity, easily trap electrons of the dangling bonds to effectively eliminate them. Therefore, even when the amount of oxygen is very small, say about $4 \times 10^{-2}$ to $10^{-5}$ atomic %, its effect is very pronounced and the high bonding affinity thereof further contributes to the stability and durability of the layer, inclusive of its heat resistance. The above-mentioned maximum limit to the oxygen content, i.e. $\leq 4 \times 10^{-2}$ atomic %, is imposed because any excess of oxygen would detract drastically from the photosensitivity of the layer. The reason why this phenomenon occurs is that the oxygen in excess of eliminating the dangling bonds begins to form $SiO_2$ bonds. The $SiO_2$ crystal has a band gap of about 7 eV and does not display photoconductivity in the visible region of the spectrum. Conversely, if the amount of oxygen is below $10^{-5}$ atomic %, it does not fully eliminate the dangling bonds and does not give an a-Si photoconductive layer with a dark resistance of more than $10^{13}$ Ω·cm.

Thus, when about 10 to 40 atomic % of hydrogen and about $4 \times 10^{-2}$ to $10^{-5}$ atomic % of oxygen is incorporated, the dangling bonds in the a-Si film are almost completely eliminated and the local level in the mobility gap is reduced to a very small value. Thus, though it is an amorphous semiconductor, it is very easy to control the Fermi level by atomic valency control. In other words, a marked improvement has been realized in the efficiency of addition of trivalent and pentavalent impurities. Particularly, trivalent impurities such as boron which will act as acceptors can be incorporated at the level of about 10 ppm at the minimum and 20,000 ppm at the maximum, although the amount depends partly on oxygen content, to thereby contribute considerably to the attainment of an a-Si layer having a dark resistance of $10^{13}$ Ω·cm or more. It has, thus, been made possible to obtain a highly conductive and easily controllable a-Si layer which features an unprecedentedly high efficiency of addition of impurities.

However, the structure of a-Si varies greatly with manufacturing conditions and especially its dark resistance and photosensitivity characteristics are considerably influenced by such conditions. Thus, when many samples of a-Si photoconductive layers containing hydrogen, oxygen and, as impurity, an element or elements of Group IIIA of Periodic Table of the Elements were produced by the noted glow discharge decomposition method under various conditions and examined for general electrophotographic characteristics, it was found that some a-Si photoconductive layers have dark resistances below $10^{13}$ Ω cm and low in electric charge acceptance capability while others have sufficiently high dark resistances but are too low in photosensitivity. That is to say, these layers cannot be used as photoconductive layers for electrophotography. The foregoing means that the mere existance of hydrogen, oxygen and impurities in the a-Si layer is not sufficient to make it suitable for electrophotography.

The various experiments performed by the present inventors for elucidating the cause led to the finding that the mode of silicon-hydrogen bonding in the a-Si layer has a significant influence on the dark resistance and photosensitivity characteristics of the photoconductive layer. This will be explained in further detail below. The infrared absorption spectrum of a-Si shows an infrared absorption at the wavenumber of about 1900 to 2200 $cm^{-1}$. The wavenumber of 2000 $cm^{-1}$ corresponds to the absorption peak of the Si-H bond and the wavenumber of 2090 $cm^{-1}$ to the absorption peak of Si-H$_2$ and (SiH$_2$)$_n$ bonds. As mentioned hereinbefore, in the a-Si solar cell, the infrared absorption of Si-H bonds at 2000 $cm^{-1}$ is predominant, with the absorption of Si-H$_2$ bonds at 2090 $cm^{-1}$ being almost negligible. Referring back to the a-Si photoconductive layers of this invention which are produced by the glow discharge decomposition method and containing hydrogen, oxygen and an impurity of Group IIIA of Periodic Table of the Elements within the above-mentioned ranges, some of them have infrared absorption peaks at or near the wavenumber of 2000 $cm^{-1}$ where the Si-H bond is predominant as is true of solar cells, others have infrared absorption peaks about half-way between 2000 $cm^{-1}$ and 2090 $cm^{-1}$, and still others have absorption peaks at or near 2090 $cm^{-1}$ where the Si-H$_2$ bond is predominant.

When the electrophotographic characteristics of these a-Si photoconductive layers were examined, it was found that whereas the a-Si layers which have absorption peaks at or near the wavenumber of 2000 $cm^{-1}$, that is to say the a-Si layers wherein the absorption of Si-H bonds is predominant, are low in dark resistance and charge receptivity, the a-Si layers having absorption peaks at or near 2090 $cm^{-1}$ where the absorption of Si-H$_2$ bonds is predominant are too low in photosensitivity for electrophotographic use. This fact implies that the mode of silicon-hydrogen bonding is an important factor in the application of a-Si layers to electrophotography and indicates that an excess of Si-H bonds or of Si-H bonds make a-Si unsuitable for use as electrophotographic photoconductive layers.

The present inventors found that if the ratio of the infrared absorption coefficient of the peak at 2100 $cm^{-1}$ to that of the peak at 2000 $cm^{-1}$, i.e. $\alpha(2090)/\alpha(2000)$, of an a-Si photoconductive layer could be controlled within the range of about 0.2 to 1.7, preferably about 0.5 to 1.5, there would be obtained an a-Si photoconductive layer excellent in all the electrophotographic characteristics inclusive of dark resistance and photosensitivity. Thus, the a-Si photoconductive layer according to this invention is not only characterized in that it contains about 10 to 40 atomic percent of hydrogen, about $10^{-5}$ to $4 \times 10^{-2}$ atomic percent of oxygen, and 10 to 20000 ppm of impurity of Group IIIA of Periodic Table of the Elements but also characterized in that the infrared absorption coefficient ratio of 2090 $cm^{-1}$ to 2000 $cm^{-1}$ is within the range of about 0.2 to about 1.7 as specified above. Only when all of the above requirements are met, is there obtained a photoconductive layer such that it has a high dark resistance and a satisfactory photosensitivity, permits control of conductivity over a broad range and is excellent in manufacturing reproducibility and stability.

The a-Si photoconductive layer according to this invention is preferably produced by the glow discharge decomposition method to be described below in detail. To effect glow discharge, methods such as induction coupling and capacitance coupling could be employed. While the above-mentioned range of absorption coefficient ratio depends on various factors, the ratio depends primarily on the high frequency power supplied. More specifically, in the case of glow discharge by the induction coupling shown in FIG. 1, the high frequency power of the resonance oscillation coil (indicated by numeral 22) should be set to about 0.3 to 3 kilowatts to obtain an a-Si photoconductive layer with the absorption coefficient ratio of about 0.2 to 1.7. Preferably, by setting the power to about 0.8 to 2 kilowatts, there is obtained an a-Si photoconductive layer with the ratio of about 0.5 to 1.5. In the case of glow discharge by the capacitance coupling shown in FIG. 2, the high frequency power supplied to the electrodes should be about 0.05 to 1.5 kilowatts in order to obtain the ratio of absorption coefficient of $\alpha(2090)/(2000)$ of about 0.2 to 1.7 and more preferably the power to be set to about 0.15 to 1.2 kilowatts to obtain the ratio of about 0.5 to 1.5 Any a-Si photoconductive layer produced with a high frequency power of less than about 0.3 kilowatts for the induction coupling type and about 0.05 kilowatts for the capacitance coupling type will have an absorption peak at or near 2000 $cm^{-1}$ where Si-H bonds are predominant and have a considerably low charge receptivity, while any a-Si photoconductive layer produced with a high frequency power of more than about 3 kilowatts for the induction coupling and 1.5 kilowatts for the capacitance coupling will have an absorption peak at or near 2090 cm$^{-1}$ wherein Si-H$_2$ bonds are predominant. Moreover, in the latter case, the high power used causes a surface roughening of the a-Si layer so that it cannot be used for electrophotographic purposes.

The a-Si photoconductive layer according to this invention can be used in various forms. However, in view of its inherent pollution-free, high heat resistance and surface hardness characteristics, it is preferably used as a monolayer structure (excluding the substrate) which acts also to retain an electric charge on its surface, and is desirably formed in the thickness of about 5 to 100 microns and, for still better results, in the thickness of 10 to 60 microns. Of course, even in such a monolayer structure, there may be disposed between the substrate and the a-Si photoconductive layer an intermediate layer either designed to prevent cracking of the a-Si layer or having a certain rectifying function. It is also possible to use the a-Si layer in a laminated construction such as the one disclosed in Japanese Patent Publication No. 5349/1970. In such cases, the thickness of the a-Si photoconductive layer need only be about 0.2 to 3 microns, and on top of the layer is formed a light-transparent organic semiconductor layer, e.g. of polyvinylcarbazole or pyrazoline, in the thickness of about 10 to 40 microns.

It is also possible to provide a porous oxide layer of about 1 to 7 micron thick and formed by anodic oxidation as an intermediate layer between the substrate and the a-Si photoconductive layer. This porous oxide layer which can be formed by anodic oxidation disclosed in GB Pat. No. 1,446,111 is quite effective to prevent injection of charges from the substrate as well as to prevent lateral escape of charges on the surface of a-Si layer.

As mentioned hereinbefore, the a-Si photoconductive layer according to this invention contains, in addition to oxygen and hydrogen, about 10 to 20,000 ppm of an impurity of Group IIIA, preferably boron. The lower limit of 10 ppm is imposed because at less than 10 ppm of this impurity, there cannot be achieved a dark resistance of about $10^{13}$ ohms cm which is the minimum requirement of an electrophotographic sensitive member suited to the Carlson system. If the amount of this impurity is greater than 20,000 ppm, there will be a sudden decrease of dark resistance. The incorporation of Group IIIA impurity, e.g. boron, in a-Si is effected by feeding B$_2$H$_6$ gas, together with SiH$_4$, Si$_2$H$_6$, Si$_3$H$_8$ or the like, into the glow discharge reaction tube. Since the incorporation efficiency of the impurity is low as compared with oxygen, it is necessary to feed about 5 to 15 times the required amount of B$_2$H$_6$.

The a-Si photoconductive layer according to this invention has a spectral sensitivity characteristic encompassing all the visible range of the spectrum extending to its extreme long wave end, especially even the photographic infrared region, and in so far as the level of addition of oxygen is within the above-mentioned range, especially not more than $4 \times 10^{-2}$ atomic %, the present a-Si photoconductive layer shows a considerably higher sensitivity than the conventional Se photosensitive member or polyvinylcarbazole-TNF photosensitive member, as well as very satisfactory dark attenuation and light attenuation characteristics.

Furthermore, the a-Si layer according to this invention has a very high surface hardness (Vickers) of about 1800 to 2300 kg/m$^2$, which is about 30 to 40 times as high as that of the Se-As photosensitive member (As, 5%), about 18 to 23 times as high as that of aluminum and, in fact, as high as that of saphire. Therefore, the transfer of toner images by pressure can be easily accomplished and a metal blade can be used for cleaning. Moreover, because the crystallization temperature of a-Si is as high as about 700° C., the heat transfer method can also be utilized. Thus, as a whole, the a-Si photoconductive layer of this invention is very durable.

The glow discharge decomposition method for the production of a photosensitive member including the a-Si photoconductive layer according to this invention will be described in detail hereinafter.

Referring to FIG. 1 which shows the glow discharge decomposition apparatus of induction coupling type for producing an a-Si photoconductive layer, a first, second, third and fourth tanks 1, 2, 3 and 4 contains SiH$_4$, PH$_3$, B$_2$H$_6$ and O$_2$, respectively, as sealed therein. For all the SiH$_4$, PH$_3$ and B$_2$H$_6$ gases, the carrier is hydrogen gas. However, Ar or He may also be used in lie of hydrogen gas. The above-mentioned gases are released by opening the corresponding first, second, third and fourth regulating valves 5, 6, 7 and 8 at the flow rates controlled by respective mass flow controllers 9, 10, 11 and 12. The gases from said first, second and third tanks 1, 2 and 3 are fed to a first main pipe 13 and the oxygen gas from the fourth tank 4 is fed to a second main pipe 14. The reference numerals 15, 16, 17 and 18 indicate flow-meters, and the numerals 19 and 20 indicate check valves. The gases flowing through the first and second main pipes 13, 14 are fed to a tubular reactor 21 which has a resonance oscillation coil 22 wound therearound. As mentioned hereinbefore, the high frequency power of the coil 22 as such is preferably about 0.3 to 3 kilowatts and the frequency thereof be 1 MHz to 50 MHz. Inside the tubular reactor 21, there is mounted a motor 24-driven turntable 25, and a substrate 23 of aluminum, stainless steel, NESA glass, or the like on which an a-Si layer is to be formed is disposed on said turntable 25. The very substrate sheet 23 is uniformly preheated by a suitable heating means to a temperature of about 100° to 400° C., preferably about 150° to 300° C. Because a high degree of vacuum (discharge pressure: 0.5 to 2.0 Torr) is essential within the reaction tube 21 at the formation of the a-Si film, the tube is connected with a rotary pump 26 and a diffusion pump 27. It should be understood that an intermediate layer may have been previously formed on the substrate.

To produce an oxygen-containing a-Si film on the substrate 23 using the glow discharge decomposition apparatus described above, the first and fourth regulating valve 5, 8 are first opened to release SiH$_4$ gas from the first tank 1 and oxygen gas from the fourth tank 4. When phosphorus or boron is to be incoporated, the second or third regulating valve 6, 7 is also opened to release PH$_3$ gas from the second tank 2 of B$_2$H$_6$ gas from the third tank 3. The amounts of gases released are controlled by mass flow controllers 9, 10, 11 and 12, and the SiH$_4$ gas or a mixture of SiH$_4$ gas and PH$_3$ or B$_2$H$_6$ gas is fed through the first main pipe 13 into the reaction tube 21. At the same time, oxygen gas, in a predetermined mole ratio to SiH$_4$, is also fed through the second main pipe 14 into the tube 21. A vacuum of 0.5 to 2.0

Torr is maintained in the reaction tube 21, the substrate is maintained at 100° to 400° C., the high frequency power of the resonance oscillation coil is set to 0.3 to 3 kilowatts and frequency set at 1 to 50 MHz. Under the above conditions, a glow discharge takes place to decompose the gases and thereby deposit an a-Si film containing oxygen and hydrogen or an a-Si layer containing both of them and a suitable proportion of phosphorus or boron at the speed of about 0.5 to 5 microns/60 minute.

Figure 2:
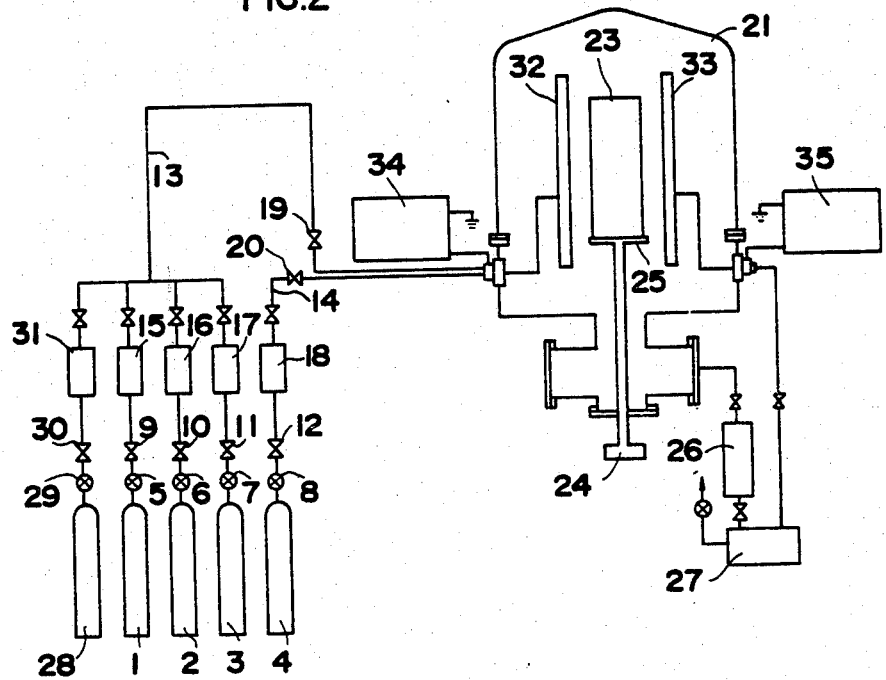

FIG. 2 shows a glow discharge decomposition apparatus of capacitance coupling type from which an a-Si photoconductive layer according to the present invention can be formed. It should be noted that same numerals will be used for parts same as those shown in FIG. 1.

In FIG. 2, a fifth tank 28 contains therein $H_2$ gas which acts as a carrier gas for $SiH_4$ gas contained in the first tank 1. $H_2$ gas is discharged from the fifth tank 28 by opening a fifth regulating valve 29 while its amount of flow is controlled by a mass flow controller 30. Designated by 31 is a check valve and $H_2$ gas discharged from the fifth tank 28 is fed to the first main pipe 13 in suitable proportion with $SiH_4$ gas. First and second electrodes 32 and 33 in parallel relation to one another are provided adjacent the substrate 23 to sandwich the same. Gases fed through the first and second main pipes 13 and 14 are first drawn in and stored in the first electrode 32 temporarily and spouted into the reaction tube 21. Gases spouted and having reacted to form an a-Si layer on the substrate 23 will be taken in by the second electrode 33 for subsequent discharge outside the tube 21. First and second power sources 34 and 35 are respectively connected to said first and second electrodes 32 and 33 for supplying high frequency power of about 0.05 to 1.5 kilowatts. Other conditions are basically same as those described in connection with FIG. 1.

The following experimental examples are further illustrative of this invention.

EXPERIMENTAL EXAMPLE 1

In this experiment, the infrared absorption spectra of the a-Si photoconductive layer of this invention and the a-Si photoconductive layer produced with a high frequency input power of more than 3 kilowatts at the resonance oscillation coil 22 using the apparatus of FIG. 1 as well as that of the solar cell were measured to investigate the trend of absorption coefficients of Si-H and Si-$H_2$ bonds.

First, using the glow discharge decomposition apparatus illustrated in FIG. 1, $SiH_4$ gas carried by hydrogen gas was released from the first tank 1, and $B_2H_6$ from the third tank 3, and $O_2$ gas from the fourth tank 4 to obtain an a-Si photoconductive layer with a thickness of 20 microns containing 0.01 atomic % of oxygen and 20 ppm of boron on an aluminum substrate (Sample A). The production conditions were: discharge pressure of 1.5 Torr, substrate temperature of 200° C., high frequency power of 1.2 killowatts, frequency of 13.56 MHz, and film forming speed of 1 micron/60 min. The hydrogen content of Sample A was about 25 atomic %.

The above procedure was repeated under the same conditions except that the high frequency power was set at 3.6 kilowatts to produce an a-Si photoconductive layer containing 0.01 atomic % of oxygen and 20 ppm of boron (Sample B). In addition to the above two samples, there was provided an a-Si for solar cell use (Sample C).

Figure 3:
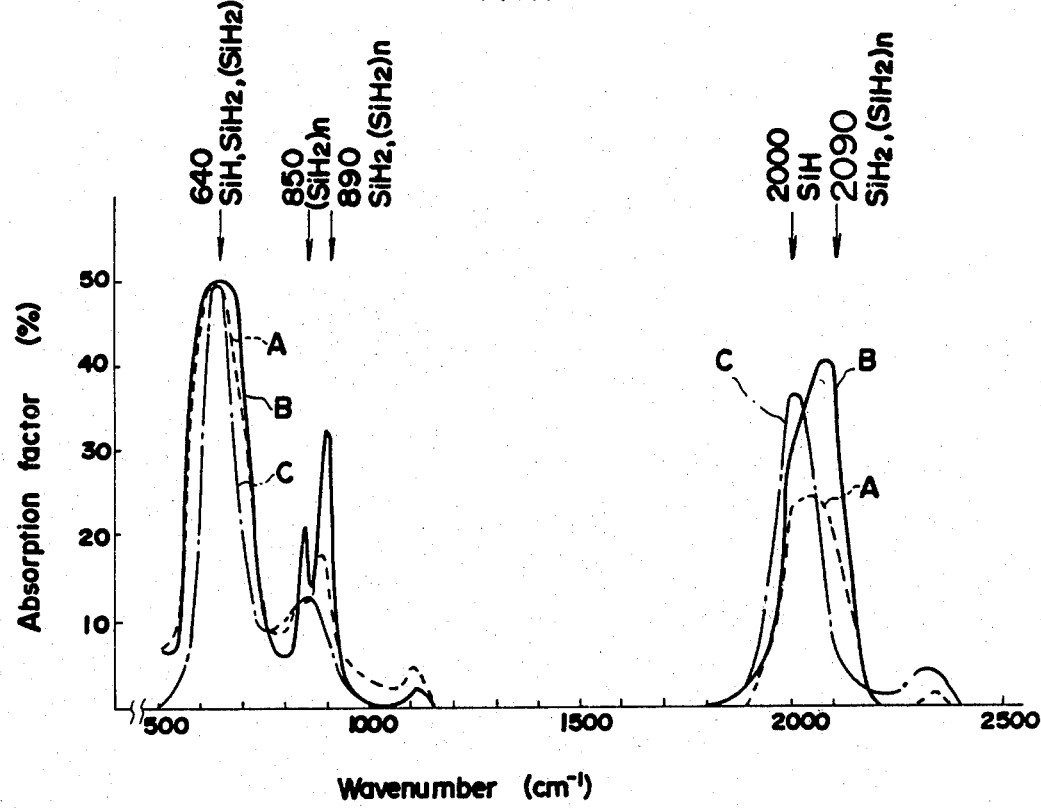
FIG. 3 shows an infrared absorption spectrum of the amorphous silicon photoconductive layer in the region of 500 cm$^{-1}$ to 2500 cm$^{-1}$.

The infrared absorption spectra of these Samples A, B and C in the wavenumber region of 500 $cm^{-1}$ to 2500 $cm^{-1}$ are reproduced in FIG. 3. In FIG. 3, absorption curves (A), (B) and (C) represent the absorption spectra of Samples A, B and C, respectively. Infrared absorption peaks are found at the wavenumbers of about 640 $cm^{-1}$, 850 $cm^{-1}$, 890 $cm^{-1}$, 2000 $cm^{-1}$ and 2090 $cm^{-1}$. The wavenumber of 640 $cm^{-1}$ corresponds to a mixture of SiH, $SiH_2$ and $(SiH_2)_n$ bonds, that of 850 $cm^{-1}$ corresponds to a predominance of $(SiH_2)$ bonds, and 890 $cm^{-1}$ corresponds to $SiH_2$ and $(SiH_2)_n$. As mentioned hereinbefore, the absorptions at 2000 $cm^{-1}$ and 2090 $cm^{-1}$ corresponds to the absorption peaks of Si-H bond and Si-$H_2$ bond, respectively. Since the relation of the infrared absorption of Si-H with that of Si-$H_2$ counts in the present context and, also, facilitates comparison, the relation between 2000 $cm^{-1}$ and 2090 $cm^{-1}$ will now be discussed.

Referring to FIG. 3 and, particularly, to Curve C, Sample C, i.e., the a-Si for solar cell use, has an absorption peak at 2000 $cm^{-1}$ where the absorption due to Si-H bonds is predominant, with the absorption due to Si-$H_2$ bonds being virtually absent. In contrast, Sample B which was produced with a high frequency power of 3.6 kilowatts has an absorption peak at 2090 $cm^{-1}$ as will be seen from Curve B, indicating that the absorption of Si-$H_2$ bonds is predominant. In the case of Sample A, as seen from Curve A, the absorption peak lies between 2000 $cm^{-1}$ and 2090 $cm^{-1}$, and both Si-H and Si-$H_2$ bonds are absorbing in a given ratio.

It will, thus, be clear that the infrared absorption coefficient ratio, $\alpha(2090\ cm^{-1})/\alpha(2000\ cm^{-1})$, of a-Si varies with different production conditions. The present inventors found that this change of absorption coefficient ratio has significant influences on the electrophotographic characteristics, especially dark resistance and photosensitivity characteristics, of a-Si and that it depends primarily on the high frequency power of said resonance oscillation coil 22.

In addition to the above Samples A and B, Samples D, E, F, G, H, I, J and K each containing 0.01 atomic % of oxygen and 20 ppm of boron were prepared under the same conditions except that the high frequency power was varied. Then, the infrared aborption spectra of all the samples inclusive of Samples A and B were measured and the $\alpha(2090)/\alpha(2000)$ ratios were determined. Table 1 shows the high frequency powers and the $\alpha(2090)/\alpha(2000)$ ratios.

TABLE 1

| Sample | High frequency power | $\alpha(2090)/\alpha(2000)$ |
|--------|----------------------|------------------------------|
| A | 1.2 | 1.0 |
| B | 3.6 | 2.0 |
| D | 0.15 | 0.16 |
| E | 0.3 | 0.2 |
| F | 0.4 | 0.3 |
| G | 0.8 | 0.52 |
| H | 1.0 | 0.75 |
| I | 1.5 | 1.2 |
| J | 2.0 | 1.4 |
| K | 3.0 | 1.7 |

Figure 4:
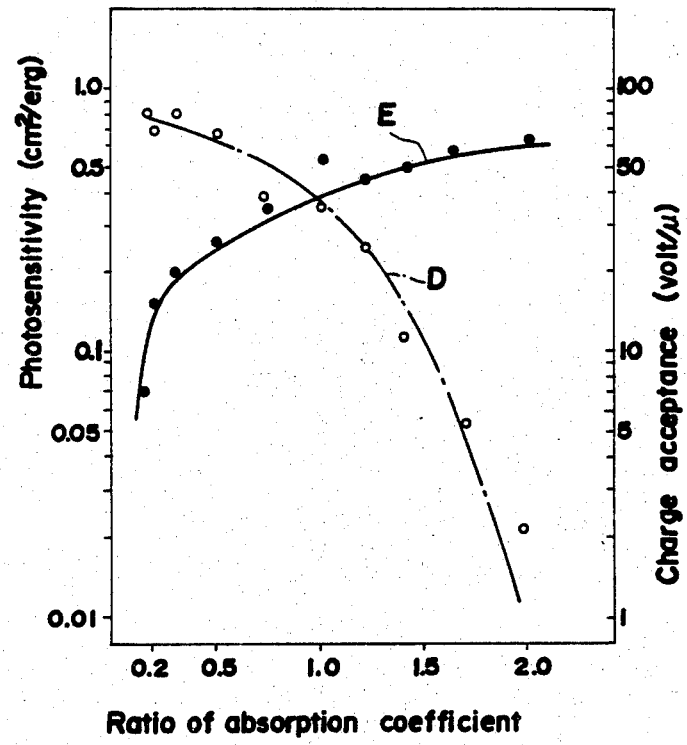
FIGS. 4 and 7 are diagrammatic representations showing respectively the relation of absorption coefficient ratio of $\alpha(2090\ cm^{-1})/\alpha(2000\ cm^{-1})$ with photosensitivity and electric charge acceptance of the amorphous silicon photoconductive layer formed in accordance with apparatuses shown in FIGS. 1 and 2.

Then, the electric charge acceptance capability (Vo) and photosensitivity characteristic (S) of each sample were investigated. In FIG. 4, the horizontal axis represents $\alpha(2090\ cm^{-1})/\alpha(2000\ cm^{-1})$, the left vertical axis represents photosensitivity ($cm^2$/erg), and the right vertical axis represents electric charge acceptance capability (volt) per micron of film thickness. The electric charge acceptance (Vo) of each sample was determined as follows. Thus, each sample was charged positively with a corona charger connected to a high voltage source of +8 KV and the surface potential per micron of thickness of a-Si was determined. To measure the photosensitivity (S) of each sample, the sample was positively charged and, then, irradiated with light. The light energy necessary to reduce the surface potential by half at the wavelength of 600 nm was determined. Referring to FIG. 4, the ○ mark denotes the photosensitivity of each sample, the ● mark denotes the electric charge acceptance of each sample, Curve D represents the overall trend of photosensitivity characteristic of each sample over the absorption coefficient ratios from 0.16 to 2.0, and Curve (E) shows the overall trend of electric charge acceptance of each sample. While Sample D, which was prepared with a low power of 0.15 kilowatts, has a high sensitivity (ca. 0.8 cm$^2$/erg) but its charge acceptance (Vo) is as low as 7 volts per micron, or only 140 volts when the film thickness is 20 microns. Thus, this Sample cannot be used as a photoconductive layer for electrophotography. On the other hand, Sample E which was prepared with a power of 0.3 kilowatts and having an absorption coefficient ratio of 0.2 has a high photosensitivity of 0.7 cm$^2$/erg and an electric charge acceptance (Vo) of 15 volts which is more than twice the receptivity of Sample D. Incidentally, the unusually high sensitivity of a-Si is apparent from the fact that the photosensitivity of the conventional Se-Te (Te, 10%) photosensitive member at 600 nm is about 0.2 cm$^2$/erg.

The charge acceptance capability (Vo) increases in proportion to absorption coefficient ratio. Thus, the (Vo) value is 20 volts for Sample F which has an absorption coefficient ratio of 0.3, and 27 volts for Sample G which has a ratio of 0.52. The photosensitivity (S) values of these samples are also high at 0.8 cm$^2$/erg and 0.68 cm$^2$/erg, respectively. The charge acceptance (Vo) values of Sample H having an absorption coefficient ratio of 0.75 and Sample A having a ratio of 1.0 are 35 volts and 54 volts, respectively, showing further improvements. These samples are high in dark resistance and display excellent electric charge receptivity characteristics. On the other hand, the photosensitivity (S) values are low as compound with Samples D, E, F and G but the respective values of 0.4 and 0.35 cm$^2$/erg are sufficiently high. Sample I having an absorption coefficient ratio of 1.2 has a high charge acceptance of 45 volts and while its photosensitivity (S) is somewhat lower, the value of 0.25 cm$^2$/erg is sufficient for electrophotography. Sample J having an absorption coefficient ratio of 1.4 has an (S) value of 0.12 cm$^2$/erg and a (Vo) value of 50 volts. Sample K having an absorption coefficient ratio of 1.7 has an (S) value of 0.052 cm$^2$/erg and a (Vo) value of 47 volts. Thus, while the charge acceptance of these samples are high, their photosensitivities are low. However, even at the (S) level of 0.052 cm$^2$/erg of Sample K, it is still sufficiently high for electrophotographic image formation. However, Sample B prepared with a high power of 3.6 kilowatts and having an absorption coefficient ratio of 2.0 had the highest electric charge acceptance of 62 volts but its photosensivity (S) is very low at 0.02 cm$^2$/erg. Moreover, due to the high electric power used, this sample had a fairly rough surface.

Figure 5:
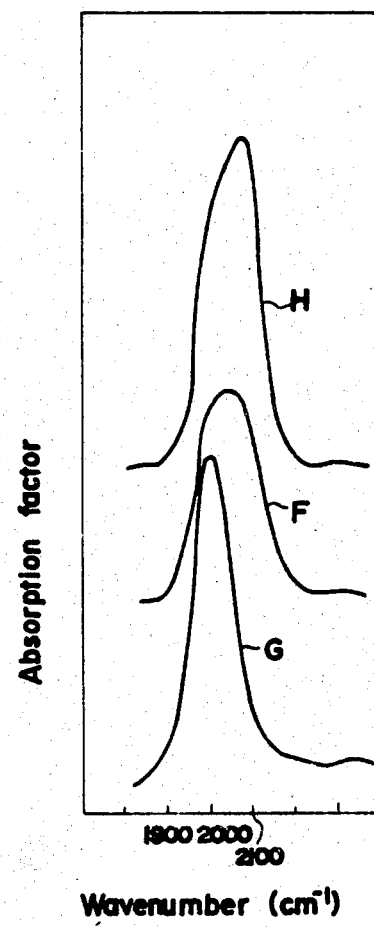
FIG. 5 is a diagram showing the absorption peaks of amorphous silicon photoconductive layers having dissimilar $\alpha(2090\ cm^{-1})/\alpha(2000\ cm^{-1})$ ratios.

The data of FIG. 4 indicate that the smaller the absorption coefficient ratio of the a-Si photoconductive layer, the higher is its photosensitivity but the lower is its electric charge acceptance capability and that, conversely, the larger the absorption coefficient ratio of the a-Si layer, the higher is its electric charge acceptance but the lower is its photosensitivity. In other words, the greater the absorption due to Si-H bonds as compared with that due to Si-H$_2$, the lower is the electric charge acceptance of the photoconductive layer. Conversely, the greater the absorption due to Si-H$_2$ bonds, the lower is the photosensitivity of the layer. FIG. 5 shows the infrared absorption peaks of Samples A, D and K in the region of 2000 cm$^{-1}$ to 2090 cm$^{-1}$. It will be apparent that Sample A having an absorption coefficient ratio of 1.0 as represented by Curve (F) has an absorption peak substantially half-way between 2000 cm$^{-1}$ and 2090 cm$^{-1}$, indicating that it contains Si-H and Si-H$_2$ bonds in equal proportions. On the other hand, Sample D having an absorption coefficient ratio of 0.16 as represented by Curve (G) has an absorption peak at exactly 2000 cm$^{-1}$, which means a preponderance of Si-H bonds, thus showing an absorption spectrum similar to that of Sample C, the a-Si for solar cell use. Conversely, Sample K having an absorption coefficient ratio of 1.7 as represented by Curve (H) has an absorption peak at the wave-number near 2090 cm$^{-1}$ indicating a high proportion of Si-H$_2$ bonds.

Figure 6:
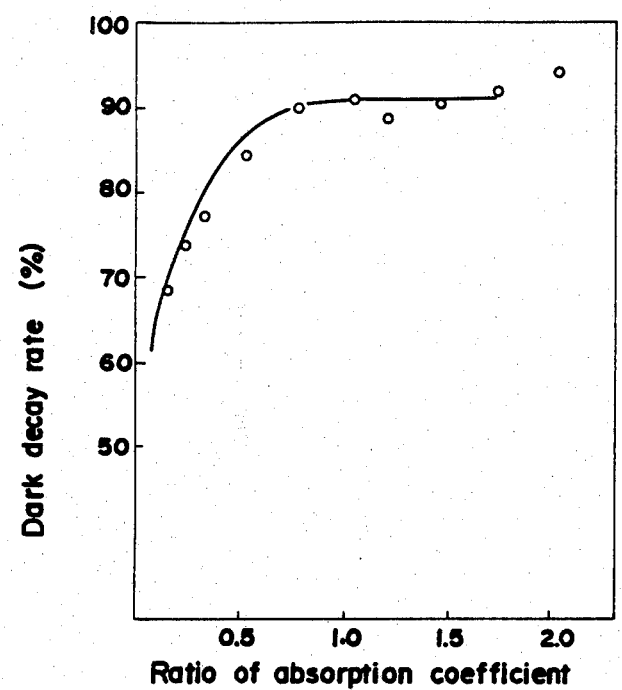
FIG. 6 is a diagram illustrating the relation of $\alpha(2090\ cm^{-1})/\alpha(2000\ cm^{-1})$ ratio with dark attenuation rate of the amorphous silicon photoconductive layer.

The dark attenuation characteristics of the same Samples A, B, D, E, F, G, H, I, J and K were then investigated. The results are shown in FIG. 6. In FIG. 6, the horizontal axis represents absorption coefficient ratio, $\alpha(2090\text{ cm}^{-1})/\alpha(2000\text{ cm}^{-1})$, and the vertical axis represents dark attenuation rate (%) as calculated by dividing the surface electric potential one second after charging by the initial surface electric potential and multiplying the quotient by 100. All the samples with absorption coeffient ratios not less than 0.75 have very satisfactory dark attenuation rates of about 90% or more. In contrast, the dark attenuation rate of Sample G having an absorption coefficient ratio of 0.52 is 85%, that of Sample E having a dark attenuation ratio of 0.2 is 75%, and that of Sample D having a ratio of 0.16 is 68%. Thus, dark attenuation becomes gradually faster.

Then, each Sample was subjected to charging, imagewise exposure, magnetic brush development and transfer processes to investigate the picture quality of the copy. A global evaluation of results of this copying test as well as the data shown in FIGS. 4 and 6 indicated that a-Si photoconductive layers in the $\alpha(2090\text{ cm}^{-1})/\alpha(2000\text{ cm}^{-1})$ range of 0.2 to 1.7 are suitable for electrophotographic use and that particularly a-Si photoconductive layers in the $\alpha(2090\text{ cm}^{-1})/\alpha(2000\text{ cm}^{-1})$ range of about 0.5 to 1.5 have excellent electrophotographic characteristics unshared by the conventional photosensitive members.

EXPERIMENTAL EXAMPLE 2

Using the glow discharge decomposition apparatus of capacitance coupling type shown in FIG. 2, the diffusion pump 26 is operated followed by operation of the rotary pump 27 to bring the reaction tube 21 to a vacuum state of about 10$^{-6}$ Torr. By opening the first, fourth and fifth regulating valves 5, 8 and 29, SiH$_4$, O$_2$ and H$_2$ gases were discharged from the first, second and fifth tanks 1, 4 and 28 at a rate of 30 sccm for SiH$_4$, 10 sccm for O$_2$ and 300 sccm for H$_2$. In addition, B$_2$H$_6$ gas using H$_2$ as carrier was discharged from the third tank 3 by opening the third regulating valve 7 at a rate of 80 sccm. The amount of flow of each gas is controlled by mass flow controllers 9, 10, 12 and 30. Applying the high frequency power of 0.5 kilowatts to first and second electrodes 32 and 33 after adjusting the pressure in the tube to be 1.0 Torr, frequency of 13.56 MHz and the substrate temperature of 200° C., an a-Si layer of 20 micron thick containing about 25 atomic % of hydrogen, 0.01 atomic % of oxygen and 40 ppm of boron was formed (Sample L).

In addition to the above Sample L, Samples M to U each containing 0.01 atomic % of oxygen and 40 ppm of boron were prepared under the same conditions except that the high frequency power to first and second electrode were varied. Then, the infrared absorption spectra of all the samples inclusive of Samples L were measured and the $\alpha(2090)/\alpha(2000)$ ratios were determined. Table 2 shows the high frequency powers and the $\alpha(2090)/\alpha(2000)$ ratios.

TABLE 2

| Sample | High frequency power | $\alpha(2090)/\alpha(2000)$ |
|---|---|---|
| L | 0.5 | 1.0 |
| M | 0.02 | 0.08 |
| N | 0.05 | 0.2 |
| O | 0.1 | 0.38 |
| P | 0.15 | 0.5 |
| Q | 0.2 | 0.6 |
| R | 1.0 | 1.38 |
| S | 1.2 | 1.5 |
| T | 1.5 | 1.7 |
| U | 1.8 | 1.83 |

Figure 7:
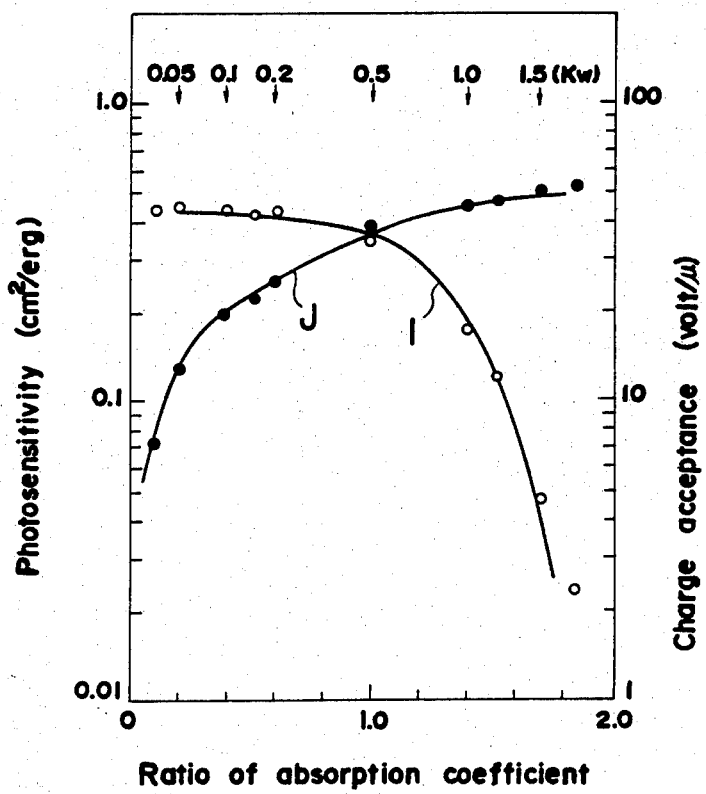

In the similar manner as in FIG. 4 discussed in connection with Example 1, the charge acceptance capability (Vo) and photosensitivity characteristics (S) of each sample were measured the results of which are shown in FIG. 7. As represented by Curve I and O marks which show the photosensitivity characteristic of each sample over the absorption coefficient ratios from 0.08 to 1.83 and by Curve J and marks which show the charge acceptance of each sample, the data of FIG. 7 indicate quite similar result as those of FIG. 4. This is to say that smaller the absorption coefficient ratio of the a-Si photoconductive layer, the higher is its photosensitivity but the lower is its electric charge acceptance capability and that, conversely, the larger the absorption coefficient ratio of the a-Si layer, the higher is its electric charge acceptance but the lower is its photosensitivity. In other words, the greater the absorption due to Si-H bonds as compared with that due to Si-H$_2$, the lower is the electric charge acceptance of the photoconductive layer. Conversely, the greater the absorption due to Si-H$_2$ bonds, the lower is the photosensitivity of the layer.

From FIG. 7, Sample M with the high frequency power of 0.02 kilowatts showed a poor charge acceptance (Vo) of only about 7 volts/$\mu$ although it had high photosensitivity of 0.42 cm$^2$/erg. With the power increased to 0.05 kilowatts, i.e, in the case of a-Si photoconductive layer having absorption coefficient ratio of 0.2, Vo improved to 13 volts while maintaining high photosensitivity. The charge acceptance further increased with the increase of high frequency power although the photosensitivity gradully decreases. The charge acceptance becomes as high as 46 volts with the power of 1.2 kilowatts (the ratio of 1.5) while the photosensitivity is still as high as 0.12 which rivals that of conventional Se-As photoconductive layer. Even with the power of 1.5 kilowatts, i.e., the ratio of 1.7, the photosensitivity is about 0.05 cm$^2$/erg which is still permissible. In fact, each of sample subjected to image formation processes revealed reproduction of generally fine images from a-Si photoconductive layers in the $\alpha(2090$ cm$^{-1})/\alpha(2000$ cm$^{-1})$ range of about 0.2 to 1.7 (high frequency power of about 0.05 to 1.5 kilowatts) and particularly fine images from those in the ratio range of about 0.5 to 1.5 (high frequency power of 0.15 to 1.2 kilowatts). Those formed under the power of 0.02 and 1.8 kilowatts respectively resulted in reproduction of poor image.

EXPERIMENTAL EXAMPLE 3

In this experiment, the dark resistance values of a-Si photoconductive layers having an $\alpha(2100$ cm$^{-1})/\alpha(2000$ cm$^{-1})$ ratio of 0.52 and containing hydrogen but no oxygen at all were determined.

Using the glow discharge decomposition apparatus of FIG. 1, SiH$_4$ gas carried by hydrogen gas (10% SiH$_4$ to hydrogen) was released from the first tank 1 and decomposed to form a pure a-Si layer, 20 microns thick, on a substrate of aluminum. The production conditions used were: discharge pressure 1.5 Torr, aluminum substrate temperature 200° C., high frequency power 0.8 kilowatt, frequency 13.56 MHz, and film formation speed 1 micron/60 min.

Then, under the same conditions as above, a-Si layers containing about 20 ppm, 200 ppm and 2000 ppm, respectively, of boron were formed in the thickness of 20 microns. These boron contents correspond to the B$_2$H$_6$/SiH$_4$ mole ratios of 10$^{-3}$, 10$^{-4}$ and 10$^{-5}$, respectively. However, since, as mentioned hereinbefore, the efficiency of incorporation of boron in a-Si is 1/5 to 1/15, the mole ratio of B$_2$H$_6$/SiH$_4$ was set at about 10 times the amount of boron to be incorporated. The boron contents were measured with a Hitachi ion microanalyzer.

Similarly, a mixed gas of SiH$_4$ and PH$_3$ was fed into the glow discharge reaction tube to produce a-Si layers containing 10, 100, and 1000 ppm of phosphorus in the thickness of 20 microns.

Figure 8:
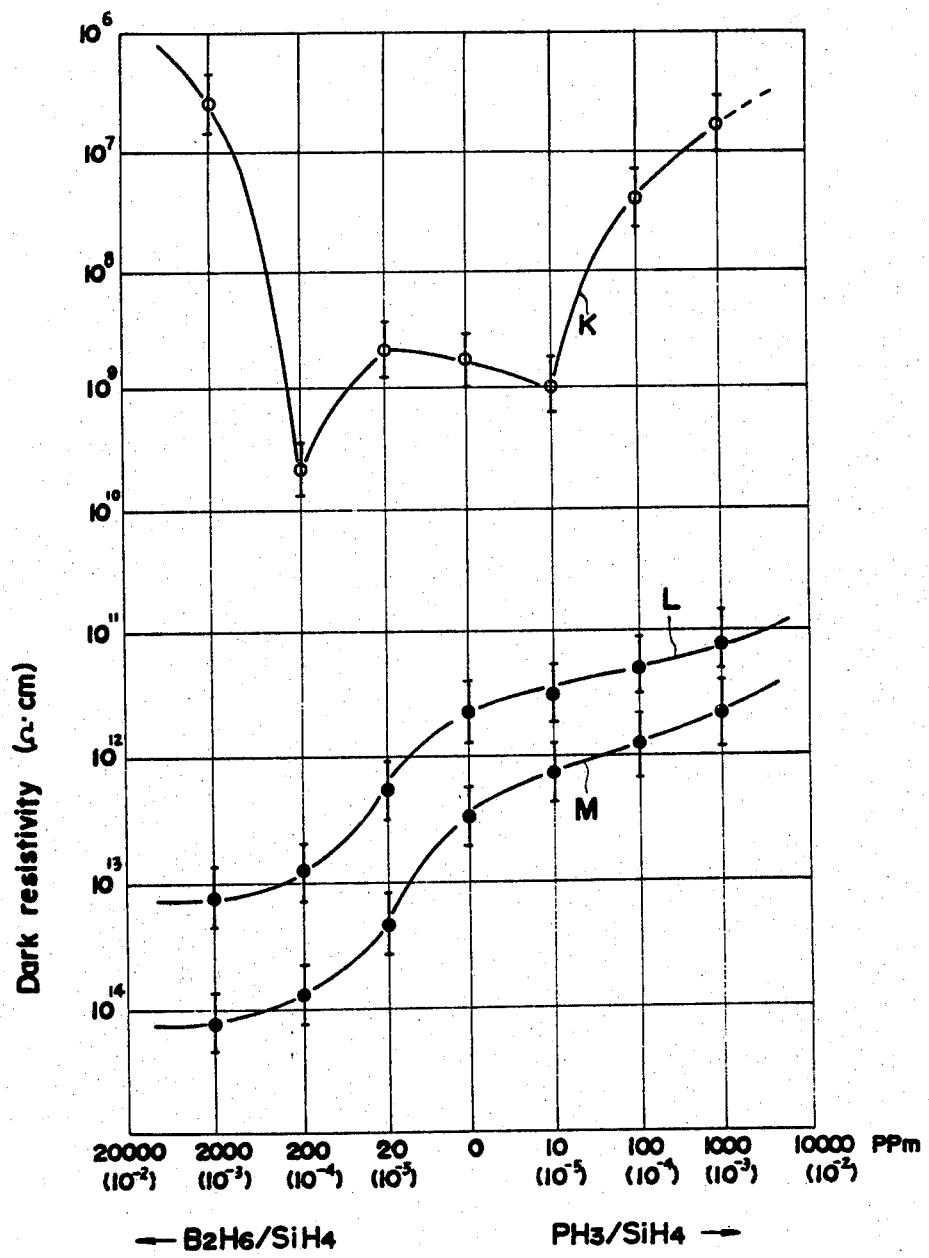
FIG. 8 is a diagram showing changes in dark resistance when boron or phosphor is added to an oxygen-containing amorphous silicon photoconductive layer and to an oxygen-free amorphous silicon photoconductive layer.

Then, the dark resistances of the above various a-Si layers were determined. Referring to FIG. 8, the solid line (K) represents the measured data. In FIG. 8, the contents of boron and phosphorus are expressed in ppm, and the figures in parentheses are mole ratios of B$_2$H$_6$/SiH$_4$ or PH$_3$/SiH$_4$. The mole ratios are based on the assumption that the respective efficiencies of incorporation are equal to 100%.

It will be seen from FIG. 8 that the dark resistance of a pure a-Si layer is less than 10$^9$ ohms·cm as represented by the solid line and that the incorporation of phosphorous at the level of 10 ppm does not result in any substantial increase of dark resistance. When a still larger amount of phosphorus is incorporated, there occurs a sudden decrease of dark resistance. Thus, the dark resistance values are about 4×10$^7$ ohms·cm at the phosphorous level of 100 ppm and about 8×10$^6$ ohms·cm at the level of 1000 ppm. On the other hand, when boron is incorporated in a-Si, the maximum dark resistance value of about 6×10$^9$ ohms·cm is attained with about 200 ppm of boron. However, with this level as a boundary, there occurs a sudden decrease of dark resistance. Thus, the value is as low as 10$^7$ ohms·cm with 2000 ppm of boron. Thus, any a-Si layer containing hydrogen but no oxygen shows only a dark resistance of 10$^{10}$ ohms·cm at best despite the addition of boron or phosphorus, thus endosing the fact that such a layer cannot be used as an electrophotographic photoconductive layer suited for the Carlson system which requires a dark resistance of about $10^{13}$ ohms·cm or more.

EXPERIMENTAL EXAMPLE 4

In this experiment, the dark resistance values of a-Si photoconductive layers having an absorption coefficient ratio of 0.52 and containing both oxygen and hydrogen were determined.

The procedure of Experiment 3 was repeated except that an oxygen gas having an $O_2/SiH_4$ mole ratio of about $0.75 \times 10^{-7}$ was supplied from the fourth tank 4 into the glow discharge reaction tube to produce a-Si layers containing about $10^{-5}$ atomic % of oxygen in a thickness of 20 microns. In addition, a-Si layers further containing 20, 200 and 2000 ppm of boron and a-Si layers further containing 10, 100 and 1000 ppm of phosphorus were prepared. Thus, a total of 7 different a-Si layers were provided. It was confirmed that all of these layers contained about 18 to 25 atomic % of hydrogen. The oxygen contents were measured by spark-source mass spectrometry.

Then, the dark resistance values of these various a-Si layers were measured. The results are represented by the solid line (L) in FIG. 8.

It will be seen from the solid line (L) of FIG. 8 that the a-Si layer containing oxygen and hydrogen but not doped with boron or phosphorus has a dark resistance of about $5 \times 10^{11}$ ohms·cm, which is about 1000 times as high as the dark resistance of the a-Si layer containing hydrogen alone. The incorporation of phosphorus results in a slightly decreased dark resistance and the amount of decrease is proportional to the level of addition. However, even the a-Si layer containing 1000 ppm of phosphorus has a dark resistance value in excess of $10^{11}$ ohms·cm, suggesting that the incorporation of oxygen contributes greatly to an increased dark resistance. On the other hand, the a-Si layers containing boron as well as hydrogen and oxygen showed improved dark resistances. Thus, the dark resistance is about $2 \times 10^{12}$ ohms·cm when the level of boron is 20 ppm, about $8 \times 10^{12}$ ohms·cm or near $10^3$ ohms·cm at the level of 200 ppm, and $1.5 \times 10^{13}$ ohms·cm at 2000 ppm. Thus, a-Si layers containing $10^{-5}$ atomic % of oxygen and at least 200 ppm of boron are useful as electrophotographic photoconductive layers for the Carlson system. Thus, compared with the oxygen-free a-Si layer containing the same amount of boron as prepared in Experimental Example 3, the dark resistance of a-Si was improved more than 1000-fold at the boron concentrations of 20 ppm and 200 ppm and as much as $10^6$-fold or more at the boron concentration of 2000 ppm.

Incidentally, the dark resistance of the a-Si layer reaches a plateau at the boron concentration of about 2000 ppm and substantially does not change up to the level of about 20,000 ppm. At a still higher level of boron, there occurs a sharp decrease of dark resistance.

Then, under the same conditions as above, an a-Si layer having a thickness of 20 microns and containing about $10^{-2}$ atomic % of oxygen was prepared. There were also prepared similar a-Si layers with 20, 200 and 2000 ppm of boron and 10, 100 and 1000 ppm of phosphorus. The dark resistance values of these 7 different a-Si layers are shown by the solid line (M) in FIG. 8.

Compared with the solid line (L) obtained with about 1/1000 of the above amount of oxygen, the dark resistance was increased about 10-fold as a whole. Especially the a-Si layer containing 20 ppm of boron (Sample G of Experimental Example 1) showed an increase in dark resistance from $2 \times 10^{12}$ ohms·cm to $3 \times 10^{13}$ ohms·cm. At the boron concentration of 200 ppm, the increase was from $8 \times 10^{12}$ ohms·cm to $8 \times 10^{13}$ ohms·cm, and at 2000 ppm the increase was from $1.5 \times 10^{13}$ ohms·cm to $1.5 \times 10^{14}$ ohms·cm.

Thus, the a-Si photoconductive layer useful for the Carlson system which requires a dark resistance of at least $10^{13}$ ohms·cm may contain about 20 ppm to 20,000 ppm of boron within the oxygen concentration range of $10^{-5}$ to $10^{-2}$ atomic %. Of course, as will be clear from the experiments described hereinafter, the objects of this invention may be accomplished with a maximum oxygen level of about $4 \times 10^{-2}$ atomic %. Therefore, a somewhat greater dark resistance than the solid line (M) may be expected. In that event, a dark resistance of about $10^{13}$ ohms·cm can be obtained even with the boron content of about 10 ppm. In other words, about 10 to 20,000 ppm of boron may then be incorporated.

EXPERIMENTAL EXAMPLE 5

In this experiment, the relation of oxygen content, photosensitivity and electric charge receptivity of the a-Si photoconductive layer was investigated.

In addition to the 2 different a-Si layers containing 20 ppm of boron and $10^{-5}$ atomic % and $10^{-2}$ atomic %, respectively, of oxygen as prepared in Experimental Example 4, six different a-Si layers containing $10^{-2}$, $2 \times 10^{-2}$, $3 \times 10^{-2}$, $4 \times 10^{-2}$, $5 \times 10^{-2}$ and $6 \times 10^{-2}$ atomic % of oxygen were prepared under otherwise the same production conditions.

Figure 9:
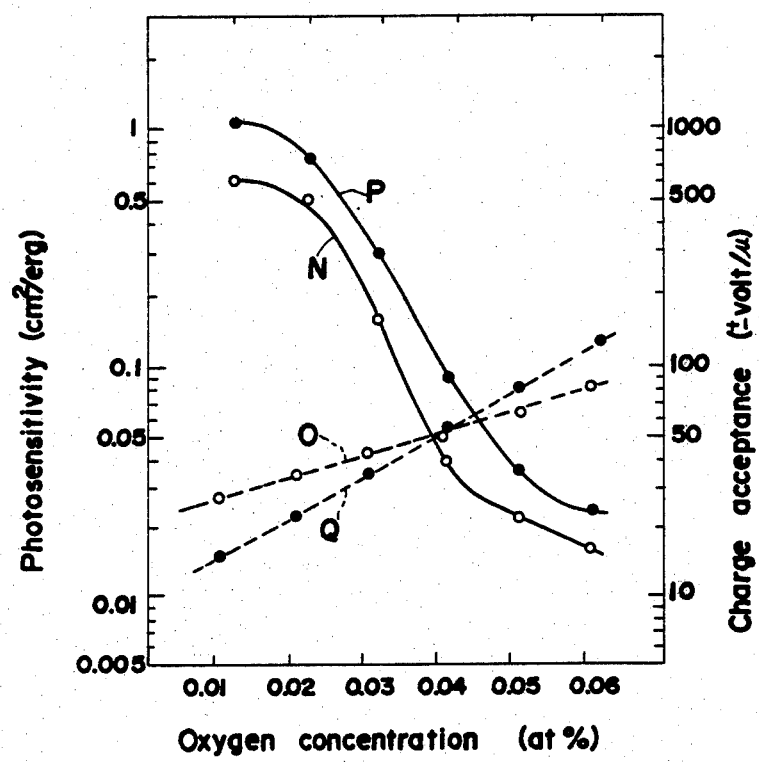
FIG. 9 is a diagram showing the relation of oxygen content with photosensitivity and electric charge acceptance of an amorphous silicon photoconductive layer.

The photosensitivity (S) and electric charge acceptance (Vo) characteristics, which depend on oxygen content, of these a-Si layers were investigated to obtain the results shown in FIG. 9. In FIG. 9, the horizontal axis represents the oxygen content (atomic %) of each a-Si layer, the left vertical axis represents the photosensitivity of each layer, and the right vertical axis represents the electric charge acceptance per micron thickness ($\pm volt/\mu$). To determine the electric charge acceptance (Vo) of each a-Si layer, the layer was charged positively and negatively with a corona charger connected to a voltage source of $\pm 8$ KV and the potential per micron of a-Si film was measured. To measure the photosensitivity (S) of each a-Si layer, the layer was charged positively and negatively, irradiated with light and the light energy necessary to reduce the surface potential by half was measured at the wavelength of 600 nm. The ○ mark shows the photosensitivity and electric charge acceptance values at positive charging and the overall trends thereof are represented by Curves (N) and (O). The mark ● shows the photosensitivity and electric charge acceptance values at negative charging and the trends are shown by Curves (P) and (Q).

Referring to FIG. 9, the a-Si layer containing 0.01 atomic % of oxygen (Sample G of Experimental Example 1) has excellent characteristics; when charged positively, it showed a high photosensitivity (S) of 0.68 cm²/erg and an electric charge acceptance of 27 volts. On the other hand, when charged negatively, the photosensitivity of the a-Si layer was still higher at more than 1. The electric charge acceptance (Vo) of the layer was somewhat lower at 15 volts but this could be corrected by increasing the thickness of the layer. In the case of the a-Si layer containing 0.02 atomic % of oxygen, the (S) value of 0.52 cm²/erg and the (Vo) value of 32 volts were found at positive charging, and the (S)

and (Vo) values at negative charging were 0.8 cm$^2$/erg and 20 volts. Thus, this a-Si layer showed excellent characteristics. With an increasing oxygen content, electric charge acceptance (Vo) increased but photosensitivity (S) decreased. However, even when the level of oxygen was 0.03 atomic %, the photosensitivity (S) was 0.16 cm$^2$/erg at positive charging and 0.32 cm$^2$/erg at negative charging, both of the values being higher than the conventional photosensitive members. Even when the oxygen content was 0.04 atomic %, (S) was 0.043 cm$^2$/erg at positive charging and 0.1 cm$^2$/erg at negative charging, both of the values being comparable to those of the conventional photosensitive member. Moreover, since this layer has a high electric charge acceptance (Vo) of ±50 volts, it can be used as an electrophotographic photoconductive layer. However, when the oxygen level was 0.05 atomic %, the photosensitivity (S) values became as low as about 0.02 cm$^2$/erg at positive charging and less than 0.04 cm$^2$/erg at negative charging. At the oxygen concentration of 0.06 atomic %, (S) was 0.017 cm$^2$/erg at positive charging and 0.025 cm$^2$/erg at negative charging. Thus, with these layers, it does not seem possible to obtain sharp copies. On the other hand, though not shown, the a-Si layer containing only as low as $10^{-3}$ atomic % of oxygen has a somewhat improved photosensitivity, i.e. 0.7 cm$^2$/erg at positive charging and 1.1 cm$^2$/erg at negative charging, with electric charge acceptance (Vo) values being +22 volts and −13 volts. The (S) values of the a-Si layer containing $10^{-5}$ atomic % of oxygen at positive and negative charging were similar to the (S) values of the a-Si layer containing 0.03 atomic % of oxygen, with its (Vo) values being +19 volts and −12 volts. Thus, this a-Si layer could be made useful by increasing its thickness.

Thus, the oxygen content of the a-Si photoconductive layer is preferably within the range of $10^{-5}$ atomic % to $4 \times 10^{-2}$ atomic % and, for still better results, from about $10^{-2}$ atomic % to $3 \times 10^{-2}$ atomic %.

Numerous modifications and variations of the present invention are possible in light of the above teachings and, therefore, within the scope of the appended claims, the invention may be practiced otherwise than as particularly described.

What is claimed is:

1. A photosensitive member which comprises an amorphous silicon photoconductive layer containing about 10 to 40 atomic % of hydrogen, $10^{-5}$ to $4 \times 10^{-2}$ atomic % of oxygen and about 10 to 20,000 ppm of Group IIIA impurity of the Periodic Table, said photoconductive layer exhibiting infrared absorption peaks between wavenumber of 2000 cm$^{-1}$ where Si-H bonds are predominant and wavenumber of 2090 cm$^{-1}$ where Si-H$_2$ bonds are predominant and wherein the ratio of infrared absorption coefficient peak at wavenumber 2090 cm$^{-1}$ to that of peak at wavenumber 2000 cm$^{-1}$ is within the range of 0.2 to 1.7.

2. A photosensitive member as claimed in claim 1 where said absorption coefficient ratio is preferably within the range 0.5 to 1.5.

3. A photosensitive member as claimed in claim 1 wherein said photoconductive layer is formed by glow discharge decomposition.

4. A photosensitive member as claimed in claim 3 wherein an apparatus for said glow discharge decomposition is a capacitance coupling type which includes means for applying high frequency power of about 0.05 to 1.5 kilowatts to form said photoconductive layer.

5. A photosensitive member as claimed in claim 3 wherein said glow discharge decomposition is achieved with an induction coupling type apparatus which includes means for applying high frequency power of about 0.3 to 3 kilowatts to form said photoconductive layer.

* * * * *

UNITED STATES PATENT AND TRADEMARK OFFICE
CERTIFICATE OF CORRECTION

PATENT NO. : 4,409,311
DATED : October 11, 1983
INVENTOR(S) : Takao Kawamura and Masazumi Yoshida It is certified that error appears in the above-identified patent and that said Letters Patent are hereby corrected as shown below:

On the title page delete:

[73] Assignees: Minolta Camera Kabushiki Kaisha; Takao Kawamura; Kyoto Ceramic Co., Ltd., all of Japan and insert:

[73] Assignees: Minolta Camera Kabushiki Kaisha; Takao Kawamura; Kyocera Corporation, all of Japan Signed and Sealed this Ninth Day of October 1984

[SEAL]

Attest:

*Attesting Officer*

GERALD J. MOSSINGHOFF
*Commissioner of Patents and Trademarks*